US012777852B2

(12) United States Patent
Sung et al.

(10) Patent No.: US 12,777,852 B2
(45) Date of Patent: Oct. 27, 2026

(54) CHALCOGENIDE-BASED MEMORY MATERIAL, AND MEMORY DEVICE AND ELECTRONIC APPARATUS INCLUDING THE SAME

(71) Applicant: Samsung Electronics Co., Ltd., Suwon-si (KR)

(72) Inventors: Hajun Sung, Suwon-si (KR); Minwoo Choi, Suwon-si (KR); Youngjae Kang, Suwon-si (KR); Kiyeon Yang, Suwon-si (KR); Changseung Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 101 days.

(21) Appl. No.: 18/828,335

(22) Filed: Sep. 9, 2024

(65) Prior Publication Data

US 2025/0098558 A1 Mar. 20, 2025

(30) Foreign Application Priority Data

Sep. 18, 2023 (KR) ........................ 10-2023-0124090
Jul. 29, 2024 (KR) ........................ 10-2024-0100542

(51) Int. Cl.
*H10N 70/00* (2023.01)
*G11C 13/00* (2006.01)
*H10B 63/00* (2023.01)

(52) U.S. Cl.
CPC ..... *H10N 70/8828* (2023.02); *G11C 13/0026* (2013.01); *G11C 13/0028* (2013.01);
(Continued)

(58) Field of Classification Search
CPC .. H10N 70/8828; H10N 70/841; H10N 70/20; H10N 70/25; H10N 70/826;
(Continued)

(56) References Cited

U.S. PATENT DOCUMENTS 8,982,604 B2 * 3/2015 Lee .................... H10N 70/8825 365/163
10,374,009 B1 8/2019 Cheng et al.
(Continued)

FOREIGN PATENT DOCUMENTS

CN 115620791 A 1/2023
KR 2021/0153275 A 12/2021
(Continued)

OTHER PUBLICATIONS

Extended European Search Report dated Feb. 10, 2025 for corresponding European Patent Application No. 24197802.2.
(Continued)

*Primary Examiner* — Fernando Hidalgo
(74) *Attorney, Agent, or Firm* — Harness, Dickey & Pierce, P.L.C.

(57) ABSTRACT

A chalcogenide-based memory material may include a ternary semiconductor compound having a composition represented by $X_aY'_bSe_c$, wherein the chalcogenide-based memory material may have an ovonic threshold-switching (OTS) characteristic, and a threshold voltage of the chalcogenide-based memory material may change according to a polarity and an intensity of an applied voltage. In $X_aY'_bSe_c$, X≠Y, a+b+c=1, a>0.12, b>0.18, c≥0.4, and X and Y' independently may be different ones of In, Sb, Ga, Sn, Al, Ge, Si, and P. A memory device may include the chalcogenide-based memory material. An electronic apparatus may include the memory device.

18 Claims, 26 Drawing Sheets

(52) U.S. Cl.
CPC ........ *G11C 13/0038* (2013.01); *G11C 13/004* (2013.01); *H10B 63/24* (2023.02); *H10B 63/84* (2023.02); *H10N 70/841* (2023.02)

(58) Field of Classification Search
CPC ............ H10N 70/8825; G11C 13/0026; G11C 13/0028; G11C 13/0038; G11C 13/004; H10B 63/24; H10B 63/84; H10B 63/845
USPC .......................................................... 365/148
See application file for complete search history.

(56) References Cited

U.S. PATENT DOCUMENTS

| | | | |
|---|---|---|---|
| 2018/0033826 A1 | 2/2018 | Choi et al. | |
| 2019/0115532 A1 | 4/2019 | Varesi et al. | |
| 2020/0321523 A1 | 10/2020 | Varesi et al. | |
| 2022/0246847 A1* | 8/2022 | Nugent | H10N 70/011 |
| 2023/0091136 A1 | 3/2023 | Yang et al. | |
| 2023/0119460 A1 | 4/2023 | Lim et al. | |
| 2024/0176740 A1* | 5/2024 | Simmadhari Ramadass | G06F 12/0877 |

FOREIGN PATENT DOCUMENTS

| | | |
|---|---|---|
| KR | 2023/0055240 A | 4/2023 |
| KR | 10-2530067 B1 | 5/2023 |
| WO | 2020/112544 A1 | 6/2020 |

OTHER PUBLICATIONS

Taras Ravsher et al, "Polarity-Induced Threshold Voltage Shift in Ovonic Threshold Switching Chalcogenides and the Impact of Material Composition", Phys. Status Solidi RRL, Jan. 6, 2023, 17, 2200417. https://doi.org/10.1002/pssr.202200417.

* cited by examiner

CHALCOGENIDE-BASED MEMORY MATERIAL, AND MEMORY DEVICE AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2023-0124090, filed on Sep. 18, 2023, and Korean Patent Application No. 10-2024-0100542, filed on Jul. 29, 2024, in the Korean Intellectual Property Office, the disclosures of each of which are incorporated by reference herein in its entirety.

BACKGROUND

1. Field

The present disclosure relates to a chalcogenide-based memory material, and a memory device and/or an electronic apparatus including the same.

2. Description of Related Art

According to the trend toward lighter, thinner, and smaller electronic appliances, the demand for high integration of memory devices has increased. A memory device having a cross-point structure may have a structure in which word lines and bit lines perpendicularly cross each other and a memory cell is disposed at each of crossed regions. The above structure may have memory cells that are small in a plane. In general, a memory cell in a memory device having a cross-point structure includes a 2-terminal selector and a memory device that are connected in series in order to limit and/or prevent a flow of a sneak current between neighboring memory cells. As such, an aspect ratio of a unit memory cell increases, and thus, processes for manufacturing a memory cell may be complicated and there may be a limitation in increasing a memory capacity of a memory device.

SUMMARY

Embodiments provide a chalcogenide-based memory material, and a memory device and/or an electronic apparatus including the same.

Additional aspects will be set forth in part in the description which follows and, in part, will be apparent from the description, or may be learned by practice of the presented embodiments of the disclosure.

According to an embodiment of the disclosure, a chalcogenide-based memory material may include a ternary semiconductor compound having a composition represented by $X_aY'_bSe_c$, wherein the chalcogenide-based memory material may have an ovonic threshold-switching (OTS) characteristic, and a threshold voltage of the chalcogenide-based memory material may change according to a polarity and an intensity of an applied voltage. In $X_aY'_bSe_c$, $X\neq Y$, $a+b+c=1$, $a>0.12$, $b>0.18$, $c\geq 0.4$, and X and Y' independently may be different ones of In, Sb, Ga, Sn, Al, Ge, Si, and P.

In some embodiments, a concentration of X may be greater than 12 at % and less than or equal to 40 at % in the ternary semiconductor compound.

In some embodiments, a concentration of Y' may be greater than 18 at % and less than or equal to 40 at % in the ternary semiconductor compound.

In some embodiments, concentration of Se may be greater than or equal to 40 at % and less than 75 at % in the ternary semiconductor compound.

According to an embodiment, a memory device may include a plurality of memory cells. Each of the plurality of memory cells may include a first electrode and a second electrode spaced apart from each other and facing each other, and a memory layer between the first electrode and the second electrode. The memory layer may have an OTS characteristic. A threshold voltage of the memory layer may change according to a polarity and an intensity of an applied voltage. The memory layer may include a ternary semiconductor compound having a composition of $X_aY'_bSe_c$. In $X_aY'_bSe_c$, $X\neq Y'$, $a+b+c=1$, $a>0.12$, $b>0.18$, $c\geq 0.4$, and X and Y' independently may be different ones of In, Sb, Ga, Sn, Al, Ge, Si, and P.

In some embodiments, a width of a space charge region in the memory layer due to a reset operation of the memory cell may be greater than or equal to 2 nm.

In some embodiments, a concentration of the X may be greater than 12 at % and less than or equal to 40 at % in the ternary semiconductor compound.

In some embodiments, a concentration of the Y' may be greater than 18 at % and less than or equal to 40 at % in the ternary semiconductor compound.

In some embodiments, a concentration of Se may be greater than or equal to 40 at % and less than 75 at % in the ternary semiconductor compound.

In some embodiments, a first state of the memory layer may have a first threshold voltage and a second state of the memory layer may have a second threshold voltage. The second threshold voltage may be higher than the first threshold voltage.

In some embodiments, when the memory layer is in the first state, the memory layer may be converted from the first state to the second state in response to applying a negative bias voltage to the memory layer so that a current flows from the first electrode to the second electrode.

In some embodiments, when the memory layer is in the second state, the memory layer may be converted from the second state to the first state in response to applying a positive bias voltage that is greater than or equal to the second threshold voltage to the memory layer so that a current flows from the second electrode to the first electrode.

In some embodiments, a read voltage between the first threshold voltage and the second threshold voltage may be applied to the memory layer in a read operation.

In some embodiments, the memory device may have a three-dimensional cross point structure.

In some embodiments, memory device may include a plurality of bit lines extending in a first direction, and a plurality of word lines extending in a second direction, the second direction, crossing the first direction, and the plurality of memory cells may be provided at points where the plurality of bit lines and the plurality of word lines cross each other.

In some embodiments, the memory device may have a VNAND structure.

In some embodiments, the plurality of memory cells may be arranged in a third direction and the third direction may be perpendicular to a plane including the first direction and the second direction.

In some embodiments, the memory device may include a plurality of word planes that extend along a plane including the first direction and the second direction, the plurality of word planes being spaced apart from each other in the third direction; a vertical bit line passing through the plurality of word planes and extending in the third direction; and a memory cell string extending in the third direction while surrounding the vertical bit line. One memory cell may be defined by a corresponding one of the plurality of word planes surrounding a portion of the memory cell string surrounding a portion of the vertical bit line.

According to an embodiment, an electronic apparatus may include the memory device described above.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
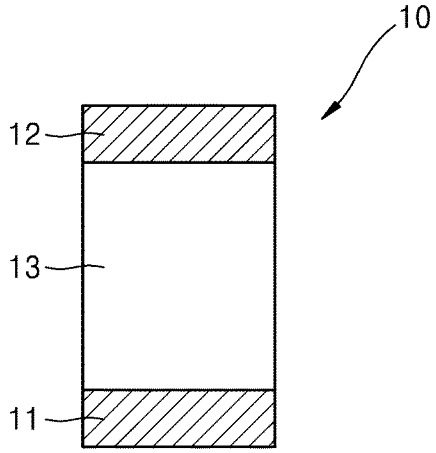
FIG. 1 is a cross-sectional view schematically showing a memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, one or more embodiments of the present disclosure will be described in detail with reference to accompanying drawings. In the drawings, like reference numerals denote like components, and sizes of components in the drawings may be exaggerated for convenience of explanation. The embodiments of the disclosure are capable of various modifications and may be embodied in many different forms.

When a layer, a film, a region, or a panel is referred to as being "on" another element, it may be directly on/under/at left/right sides of the other layer or substrate, or intervening layers may also be present. An expression used in the singular encompasses the expression of the plural, unless it has a clearly different meaning in the context. It will be further understood that when a portion is referred to as "comprising" another component, the portion may not exclude another component but may further comprise another component unless the context states otherwise.

The use of the term of "the above-described" and similar indicative terms may correspond to both the singular forms and the plural forms. Also, the steps of all methods described herein may be performed in any suitable order unless otherwise indicated herein or otherwise clearly contradicted by context.

Also, the terms " . . . unit", " . . . module" used herein specify a unit for processing at least one function or operation, and this may be implemented with hardware or software or a combination of hardware and software.

Furthermore, the connecting lines or connectors shown in the drawings are intended to represent example functional relationships and/or physical or logical couplings between the various elements. It should be noted that many alternative or additional functional relationships, physical connections, or logical connections may be present in a practical device.

The use of any and all examples, or example language provided herein, is intended merely to better illuminate the disclosure and does not pose a limitation on the scope of the present disclosure unless otherwise claimed.

FIG. 1 is a cross-sectional view schematically showing a memory device 10 according to an embodiment.

Referring to FIG. 1, the memory device 10 may include a first electrode 11, a second electrode 12 that is spaced apart from the first electrode 11 so as to face the first electrode 11, and a memory layer 13 disposed between the first electrode 11 and the second electrode 12.

The first electrode 11 and the second electrode 12 may apply a voltage to the memory layer 13. To do this, the first electrode 11 and the second electrode 12 may each include a metal, a conductive metal nitride, a conductive metal oxide, or a combination thereof. For example, the first electrode 11 and the second electrode 12 may each include at least one of titanium nitride (TiN), titanium silicon nitride (TiSiN), titanium carbon nitride (TiCN), titanium carbon silicon nitride (TiCSiN), tantalum (Ta), tantalum nitride (TaN), tantalum silicon nitride (TaSiN), tantalum aluminum nitride (TaAlN), tungsten silicide (WSi), titanium tungsten (TiW), molybdenum nitride (MoN), niobium nitride (NbN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), titanium aluminum (TiAl), titanium oxygen nitride (TiON), titanium aluminum oxygen nitride (TiAlON), tungsten oxygen nitride (WON), tantalum oxygen nitride (TaON), silicon carbon (SiC), silicon carbon nitride (TiON), carbon nitride (CN), tantalum carbon nitride (TaCN), tungsten (W), tungsten nitride (WN), and carbon (C), or a combination thereof.

The memory layer 13 may have an ovonic threshold switching (OTS) characteristic, which has a high-resistive state when being applied with a voltage less than a threshold voltage and has a low-resistive state when being applied with a voltage greater than the threshold voltage. In addition, the memory layer 13 may have a memory characteristic in which a threshold voltage is shifted according to a polarity and intensity of a bias voltage applied thereto. Therefore, the memory layer 13 may have a self-selecting memory characteristic, by which a memory function and a selector function may be both performed only with a single material. To this end, the memory layer 13 may include a chalcogenide-based material, in particular, a Se-based ternary semiconductor compound, as described later.

Figure 2:
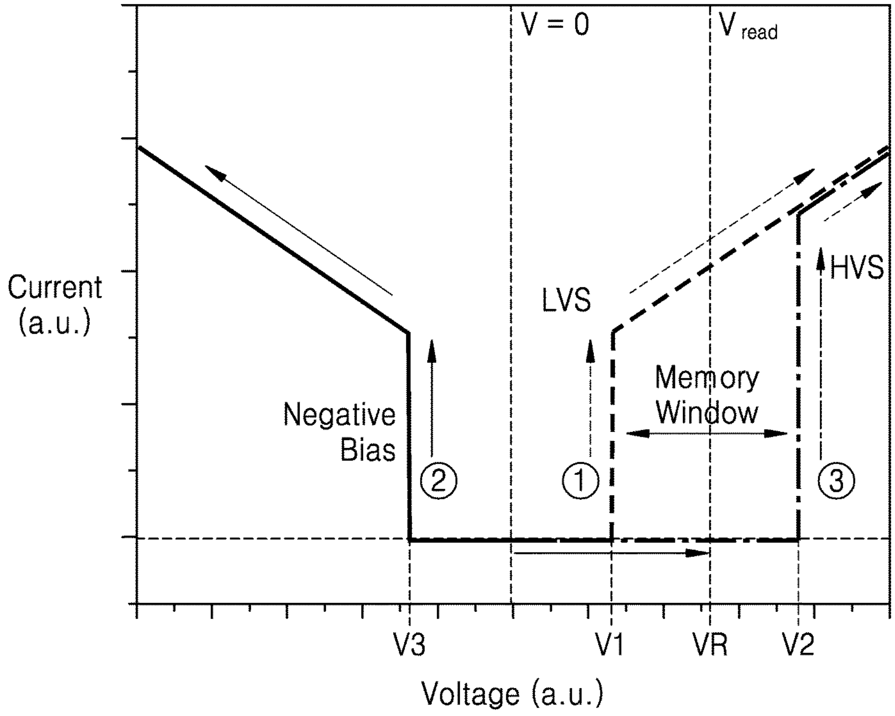
FIG. 2 is a graph showing an example of a voltage-current characteristic of a memory layer in a memory device according to an embodiment.

FIG. 2 is a graph showing an example of a voltage-current characteristic of the memory layer 13 in the memory device 10 according to an embodiment.

Referring to FIG. 2, the memory layer 13 may have one of a first state (LVX; low-Vth state) in which the threshold voltage is relatively low and a second state (HVS; high-Vth state) in which the threshold voltage is relatively high. For example, in the first state, the threshold voltage of the memory layer 13 may be a first voltage V1, and in the second state, the threshold voltage of the memory layer 13 may be a second voltage V2 that is greater than the first voltage V1.

While the memory layer 13 is in the first state, when a voltage less than the first voltage V1 is applied to the memory layer 13, a current rarely flows between both ends of the memory layer 13, and when a voltage greater than the first voltage V1 is applied to the memory layer 13, the memory layer 13 is turned on and the current flows through the memory layer 13. Also, while the memory layer 13 is in the second state, when a voltage less than the second voltage V2 is applied to the memory layer 13, the current rarely flows between both ends of the memory layer 13, and when a voltage greater than the second voltage V2 is applied to the memory layer 13, the memory layer 13 is turned on and the current flows through the memory layer 13.

Therefore, a voltage between the first voltage V1 and the second voltage V2 may be selected as a read voltage VR. When the memory layer 13 is in the first state and the read voltage VR is applied to the memory layer 13, the current flows through the memory layer 13, and at this time, a value of data stored in the memory layer 13 may be defined as "1". When the memory layer 13 is in the second state and the read voltage VR is applied to the memory layer 13, the current rarely flows through the memory layer 13, and at this time, a value of data stored in the memory layer 13 may be defined as "0". In other words, when the current flowing through the memory layer 13 while applying the read voltage VR to the memory layer 13 is measured, a value of data stored in the memory layer 13 may be read.

In addition, when the memory layer 13 is in the first state and a negative bias voltage is applied to the memory layer 13, the threshold voltage of the memory layer 13 increases and the memory layer 13 may be converted into the second state. For example, when a negative third voltage V3 is applied to the memory layer 13, the memory layer 13 may be converted into the second state. The above operation may be referred to as a reset operation. Also, when the memory layer 13 is in the second state and a positive (+) bias voltage greater than the second voltage V2 is applied to the memory layer 13, the threshold voltage of the memory layer 13 decreases and the memory layer 13 may be converted into the first state. The above operation may be referred to as a set operation. A difference between the second voltage V2, that is, a reset threshold voltage, and the first voltage V1, that is, a set threshold voltage, corresponds to a memory window.

Figure 3A:
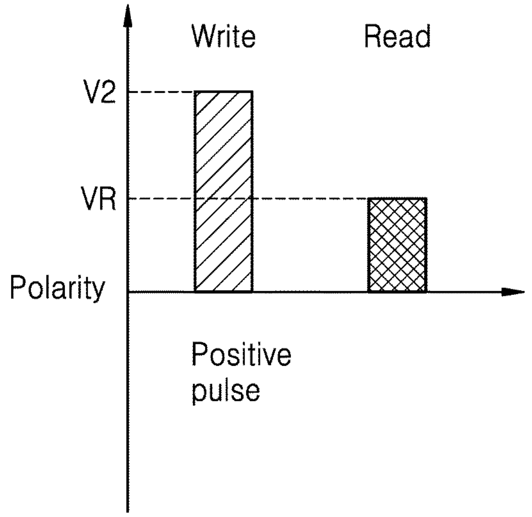
FIG. 3A is a graph showing an example of a bias voltage for performing a set operation and a read operation in a memory device according to an embodiment.

FIG. 3A is a graph showing an example of a bias voltage for a set operation and a read operation in the memory device 10 according to an embodiment. Referring to FIG. 3A, a positive bias voltage that is greater than or equal to the second voltage V2 may be applied to the memory layer 13 in the set operation. Then, the threshold voltage of the memory layer 13 may be shifted into the first voltage V1. After that, in the read operation, a positive read voltage VR between the first voltage V1 and the second voltage V2 may be applied to the memory layer 13. When the read voltage VR is applied, the memory layer 13 may be turned on.

Figure 3B:
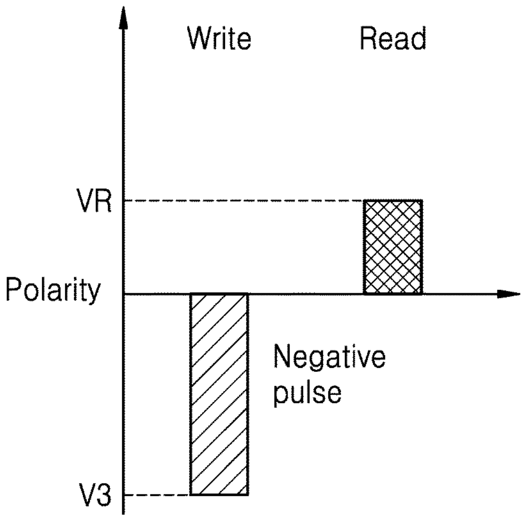
FIG. 3B is a graph showing an example of a bias voltage for performing a reset operation and a read operation in a memory device according to an embodiment.

FIG. 3B is a graph showing an example of a bias voltage for a reset operation and a read operation in the memory device 10 according to an embodiment. Referring to FIG. 3B, in the reset operation, a negative bias voltage, that is, the third voltage V3, may be applied to the memory layer 13. An absolute value of the third voltage V3 may be equal to the second voltage V2, or may be slightly less or greater than the second voltage V2. Then, the threshold voltage of the memory layer 13 may be shifted to the second voltage V2 that is greater than the first voltage V1. After that, in the read operation, a positive read voltage VR between the first voltage V1 and the second voltage V2 may be applied to the memory layer 13. When the read voltage VR is applied, the memory layer 13 may be turned off.

As described above, the memory layer 13 of the memory device 10 according to an embodiment may have an OTS characteristic, and at the same time, the memory characteristic of changing the threshold voltage. In particular, the threshold voltage of the memory layer 13 may be shifted according to the polarity of the bias voltage applied to the memory layer 13. In this point of view, the memory device 10 according to the embodiment may be a self-selecting memory device having a polarity-dependent threshold voltage shift characteristic.

The polarity-dependent threshold voltage shift behavior may be described through a change in a trap state in the memory layer 13. FIGS. 4A to 6B are diagram for conceptually describing a change in the trap state in the memory layer 13.

Figure 4A:
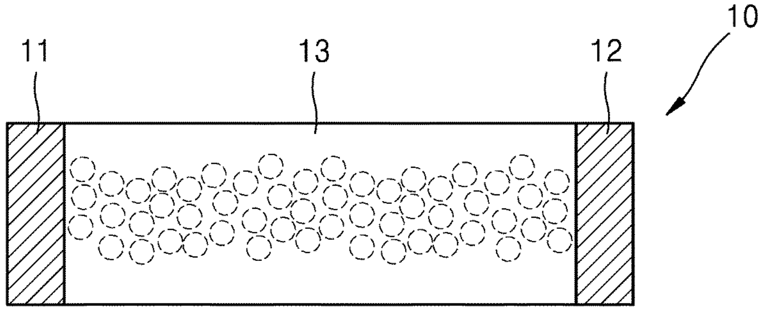
FIG. 4A is a conceptual diagram showing an example of a trap status in a memory layer in a pristine state of the memory layer in a memory device according to an embodiment.
Figure 4B:
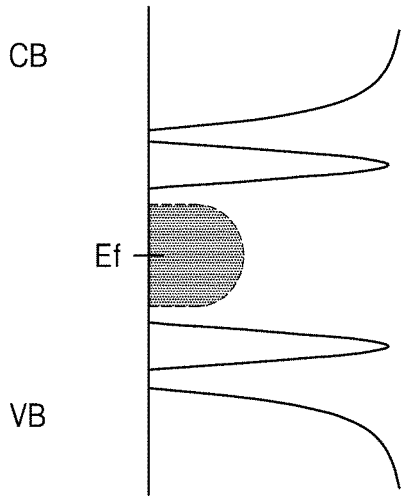
FIG. 4B is a diagram schematically showing an energy-band diagram with respect to a memory layer in a pristine state.

FIG. 4A is a conceptual diagram showing an example of a trap state in the memory layer 13 in a pristine state of the memory layer 13 in a memory device 10 according to an embodiment, and FIG. 4B is a diagram schematically showing an energy-band diagram with respect to a memory layer 13 in a pristine state.

Figure 5A:
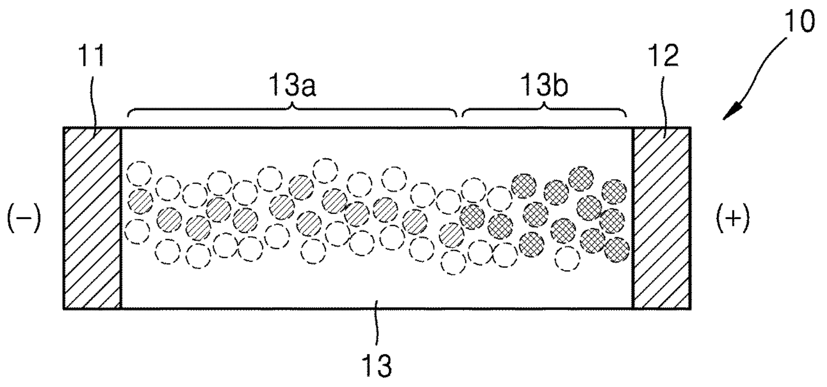
FIG. 5A is a conceptual diagram showing an example of a trap status in a memory layer after applying a positive bias voltage to a memory layer in a pristine state for a first-firing.
Figure 5B:
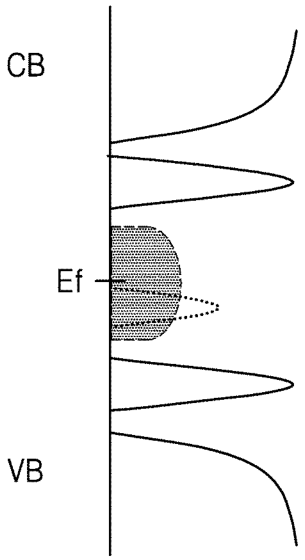
FIG. 5B is a diagram schematically showing an energy-band diagram with respect to a memory layer around a first electrode after the first-firing.
Figure 5C:
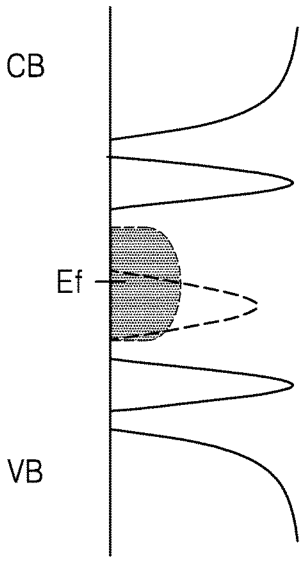
FIG. 5C is a diagram schematically showing an energy-band diagram with respect to a memory layer around a second electrode after the first-firing.

FIG. 5A is a conceptual diagram showing an example of a trap state in the memory layer 13 after applying a positive bias voltage to the memory layer 13 in a pristine state for a first-firing, FIG. 5B is a diagram schematically showing an energy-band diagram with respect to the memory layer 13 around the first electrode 11 after the first-firing, and FIG. 5C is a diagram schematically showing an energy-band diagram with respect to the memory layer 13 around the second electrode 12 after the first-firing.

Figure 6A:
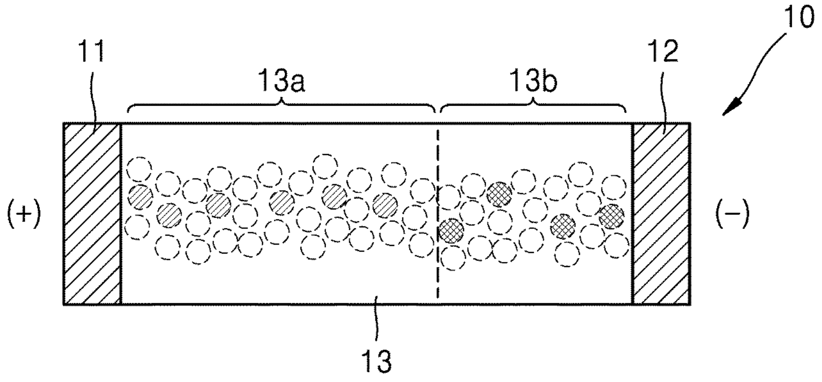
FIG. 6A is a conceptual diagram showing an example of a trap status in a memory layer after applying a negative bias voltage to a memory layer that is firstly fired.
Figure 6B:
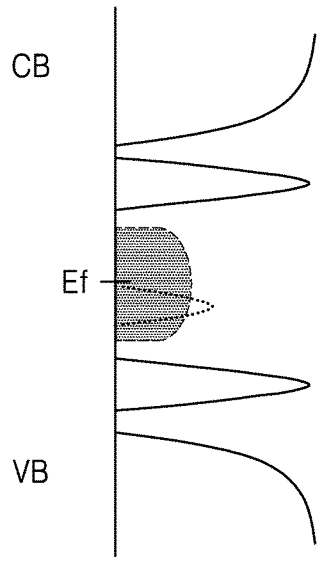
FIG. 6B is a diagram schematically showing an energy-band diagram about a memory layer region around a first electrode after applying a negative bias voltage.
Figure 6C:
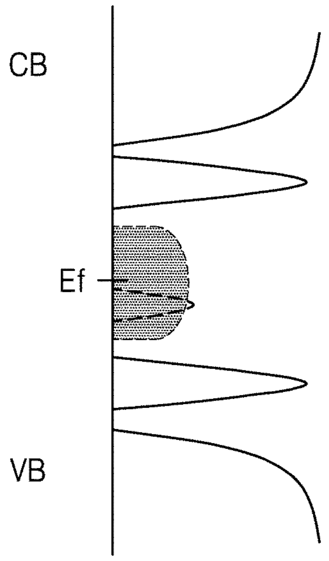
FIG. 6C is a diagram schematically showing an energy-band diagram about a memory layer region around a second electrode after applying a negative bias voltage.

FIG. 6A is a conceptual diagram showing an example of a trap state in the memory layer 13 after applying a negative bias voltage to the memory layer 13 that is firstly fired, FIG. 6B is a diagram schematically showing an energy-band diagram about a region in the memory layer 13 around the first electrode 11 after applying a negative bias voltage, and FIG. 6C is a diagram schematically showing an energy-band diagram about a region in the memory layer 13 around the second electrode 12 after applying a negative bias voltage.

Referring to FIG. 4A, de-activated traps mainly exist in the memory layer 13 in a pristine state immediately after being manufactured. For convenience of description, de-activated traps are indicated as dotted-circles in FIG. 4A. The de-activated traps may be mainly formed through covalent bond (Se—Se) among neighboring selenium (Se) elements in the memory layer 13.

Also, in the graph of FIG. 4B, CB denotes a conduction band, VB denotes a valence band, and a transverse axis denotes a density of state. Referring to FIG. 4B, the energy-band formed by the de-activated traps is expressed in a thin dashed line. In FIG. 4B, the energy-band indicated in a solid line is formed by other ingredients in the memory layer 13. The energy-band formed by the de-activated traps may be distributed about a Fermi-level Ef.

A positive (+) bias voltage may be applied in order for a first-firing of the memory layer 13 in the pristine state. For example, the bias voltage may be applied to the memory layer 13 so that the current flows from the second electrode 12 to the first electrode 11. Referring to FIG. 5A, some of the de-activated traps may be activated due to the first firing to form activated traps. The activated traps may be mainly formed by selenium ions ($Se^{2-}$) generated when the covalent bond between the Se atoms is broken. A percolation path may be formed in the memory layer 13 due to the activated traps, and when the percolation path is formed, the threshold voltage of the memory layer 13 may decrease.

In FIG. 5A, the activated traps are expressed in circles with slashes and circles with net-patterns. As shown in FIG. 5A, an amount of activated traps in the memory layer 13 may increase from the first electrode 11 toward the second electrode 12. In particular, in a region in the memory layer 13, which is close to the second electrode 12, a large amount of activated traps may be generated. Therefore, after the first firing, the memory layer 13 may have a first region 13*a* in which a density of activated traps is relatively low and a second region 13*b* in which a density of activated traps is relatively high. A thickness of the second region 13*b* may be less than that of the first region 13*a*.

The first region 13*a* is adjacent to the first electrode 11. The activated traps in the first region 13*a* are indicated as circles with slash patterns. In the first region 13*a*, the density of the activated traps may gradually increase toward the boundary with the second region 13*b*, but an increase amount may be relatively small. The second region 13*b* is adjacent to the second electrode 12. Also, the second region 13*b* may be in direct contact with the first region 13*a* and may be disposed between the first region 13*a* and the second electrode 12. The activated traps in the second region 13*b* are indicated as circles with net patterns. In the second region 13*b*, the density of the activated traps may be greatly increased closer to the boundary with the second electrode 12. Therefore, the density of the activated traps in the second region 13*b* may be greater than that of the activated traps in the first region 13*a*. In this case, the memory layer 13 may be in the first state of which the threshold voltage is relatively low. In other words, when the memory layer 13 is in the first state, the density of the activated traps in the second region 13*b* is greater than that of the activated traps in the first region 13*a*.

Referring to FIG. 5B, the energy-band formed by the activated traps in the first region 13*a* is expressed in a dotted line. The energy-band formed by the activated traps may be located at a slightly lower energy level than the Fermi level Ef. Also, referring to FIG. 5C, the energy-band formed by the activated traps in the second region 13*b* is expressed in a thick dashed-line. When comparing FIG. 5B with FIG. 5C, the energy-band formed by the activated traps in the second region 13*b* has an energy distribution that is slightly wider than that of the energy-band formed by the activated traps in the first region 13*a*. Also, a density of state of the activated traps in the second region 13*b* is greater than a density of state of the activated traps in the first region 13*a*. Therefore, an amount of the activated traps in the second region 13*b* is greater than an amount of the activated traps in the first region 13*a*.

After the first firing, the high density of the activated traps around the second electrode 12 may largely affect the shift movement of the threshold voltage in the memory layer 13. For example, the density of activated traps in the second region 13*b* may be easily changed according to a polarity of the bias voltage, and accordingly, the threshold voltage of the memory layer 13 may be easily shifted.

When a negative (−) bias voltage is applied to the memory layer 13 that is first fired, that is, when the bias voltage is applied in a backward direction to the memory layer 13 so that the current flows from the first electrode 11 to the second electrode 12, some of the activated traps in the second region 13*b* adjacent to the second electrode 12 are annihilated and changed to de-activated traps. This may be described that neighboring Se ions ($Se^{2}$) are combined again and form the covalent bonds. As a result, the density of the activated traps decreases in the memory layer 13.

When comparing FIG. 5A with FIG. 6A, after applying the negative bias voltage to the memory layer 13, the density of activated traps may be decreased in both of the first region 13*a* and the second region 13*b*. In particular, the density of the activated traps may be further decreased in the second region 13*b*. On the contrary, a variation amount in the density of the activated traps in the first region 13*a* may be less than that of the activated traps in the second region 13*b*. Accordingly, after applying the negative bias voltage to the memory layer 13, the density of the activated traps in the second region 13*b* may be less than that of the activated traps in the first region 13*a*. As such, an interface tunneling barrier (ITB) may be formed around the boundary between the first region 13*a* and the second region 13*b*.

Also, when comparing FIG. 5B with FIG. 6B, after applying the negative bias voltage to the memory layer 13, the density of state of the activated traps in the first region 13*a* may be slightly decreased. On the other hand, when comparing FIG. 5C with FIG. 6C, after applying the negative bias voltage to the memory layer 13, the density of state of the activated traps in the second region 13*b* may be greatly decreased. Also, when comparing FIG. 6B with FIG. 6C, after applying the negative bias voltage to the memory layer 13, the density of state of the activated traps in the second region is less than that of the activated traps in the first region 13*a*.

In the memory layer 13, when the amount of activated traps, in particular, in the second region 13*b* that is adjacent to the second electrode 12*b*, a greater bias voltage is necessary for forming an electric conduction path, and accordingly, the threshold voltage of the memory layer 13 may increase. Here, the memory layer 13 is in the second state having relatively greater threshold voltage. In other words, when the memory layer 13 is in the second state, the density of the activated traps in the second region 13*b* may be less than that of the activated traps in the first region 13*a*. In addition, when the memory layer 13 is in the second state, the density of activated traps in the first region 13*a* and the density of activated traps in the second region 13*b* may be respectively less than the density of activated traps in the first region 13*a* and the density of activated traps in the second region 13*b* when the memory layer 13 is in the first state.

After that, when the positive bias voltage that is greater than or equal to the threshold voltage is applied to the memory layer 13, in the memory layer 13, in particular, in the second region 13*b*, the amount of activated traps increases and the threshold voltage of the memory layer 13 may decrease again. Then, the memory layer 13 may be in the first state.

As described above, in the memory device 10 according to an embodiment, through the change in the state of the activated traps in the memory layer 13, in particular, through the large change in the state of the activated traps in the second region 13*b* that is adjacent to the second electrode 12, the threshold voltage shift movement may be implemented. In addition, the density of the activated traps in the pristine state is less than that of the activated traps while the negative bias voltage is applied after the first firing, and thus, the positive bias voltage necessary for the first firing may be greater than the positive bias voltage for decreasing the threshold voltage of the memory layer 13 after the negative bias voltage.

In the memory device 10 according to an embodiment, the memory layer 13 may include a chalcogenide-based material, e.g., Se-based ternary semiconductor compound. In detail, the memory layer may include a ternary semiconductor compound having a composition of $X_aY'_bSe_c$ ($a+b+c=1$, $a>0.12$, $b>0.18$, $c\geq 0.4$). Here, X and Y' denote different elements. X and Y' may each be one of In, Sb, Ga, Sn, Al, Ge, Si, and P.

A concentration of an X may be greater than about 12 at %. For example, the concentration of the X may be greater than 12 at % and may be less than or equal to 40 at %. The concentration of the Y' may be greater than about 18 at %. For example, the concentration of the Y' may be greater than 18 at % and may be less than or equal to 40 at %. A concentration of Se may be greater than or equal to 40 at %. For example, the concentration of Se may be greater than or equal to 40 at % and may be less than 75 at %.

In the memory device 10 according to an embodiment, the memory layer 13 includes the Se-based ternary semiconductor compound in which a space charge region is formed to have a large width of about 2 nm as described later, and thus, the memory window of the memory device may be increased. Also, the memory layer includes the ternary semiconductor compound excluding arsenic (As), and thus, environmental pollution caused by As may be reduced.

Figure 7:
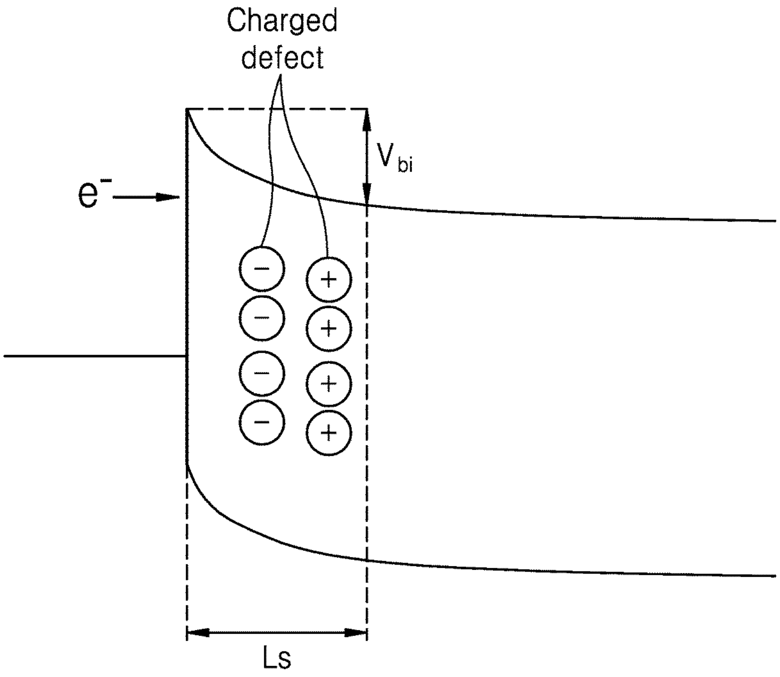
FIG. 7 is a diagram schematically showing a band diagram of a space charge region formed by a reset operation in a memory device according to an embodiment.

FIG. 7 is a diagram schematically showing a band diagram of a space charge region formed by a reset operation in the memory device 10 according to an embodiment. Referring to FIG. 7, charged defects having different polarities are accumulated around an interface of the memory layer including the Se-based ternary semiconductor compound during the reset operation, and the space charge region is formed due to band bending. The space charge region acts as an electrical barrier blocking electron injection during a read operation. In FIG. 7, Ls denotes a width of the space charge region, and $V_{bi}$ denotes a potential barrier.

Figure 8:
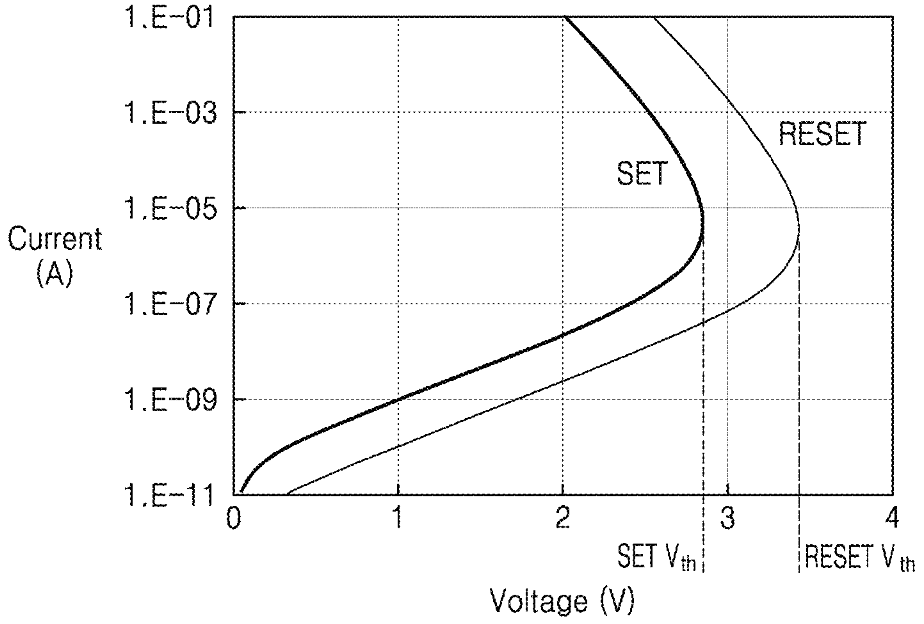
FIG. 8 is a diagram showing a result of a simulation with respect to an I-V curve that indicates a memory window generated in a memory device according to an embodiment by modeling a result shown in FIG. 7.

FIG. 8 is a diagram showing a result of a simulation showing an I-V curve that indicates that a memory window is generated in the memory device 10 according to an embodiment by modeling a result shown in FIG. 7. Referring to FIG. 8, a threshold voltage RESET $V_{th}$ in the reset operation is increased to be greater than a threshold voltage SET $V_{th}$ in the set operation, and then the memory window is generated.

Hereinafter, results of simulations in which 500 kinds of Se-based ternary semiconductor compounds are used as memory materials are described below. Here, the Se-based ternary semiconductor compound may have a composition of $X_aY'_bSe_c$ (X≠Y', a+b+c=1), and the elements X and Y' may each be one of In, Sb, Ga, Sn, Al, Ge, Si, and P.

Figure 9:
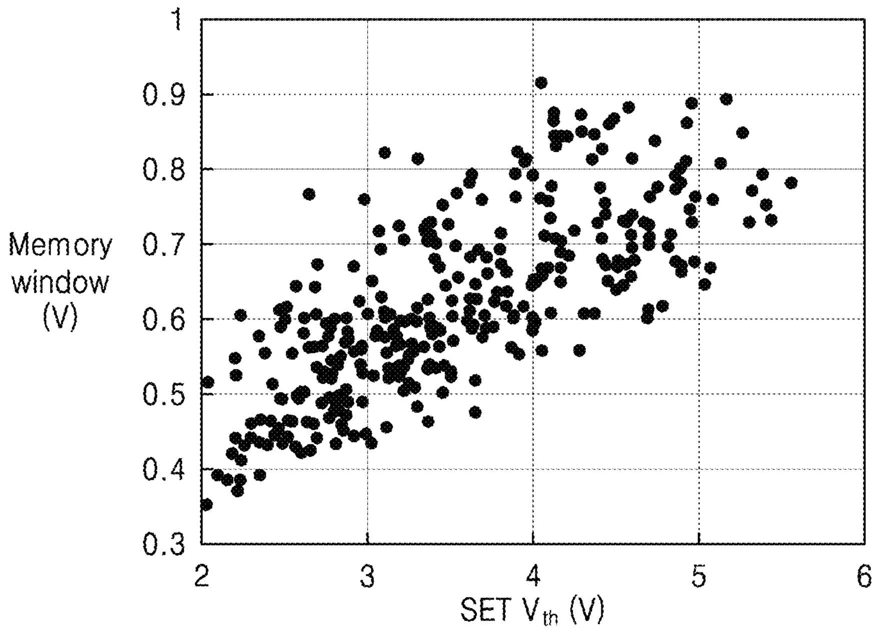
FIG. 9 is a diagram showing a result indicating a trend of a memory window according to a set threshold voltage by performing simulations on about 500 kinds of Se-based ternary semiconductor compounds.

FIG. 9 is a diagram showing a result indicating a trend of a memory window according to a set threshold voltage SET $V_{th}$ by performing simulations on about 500 kinds of Se-based ternary semiconductor compounds. Referring to FIG. 9, as the set threshold voltage increases, the memory window tends to increase.

Figure 10:
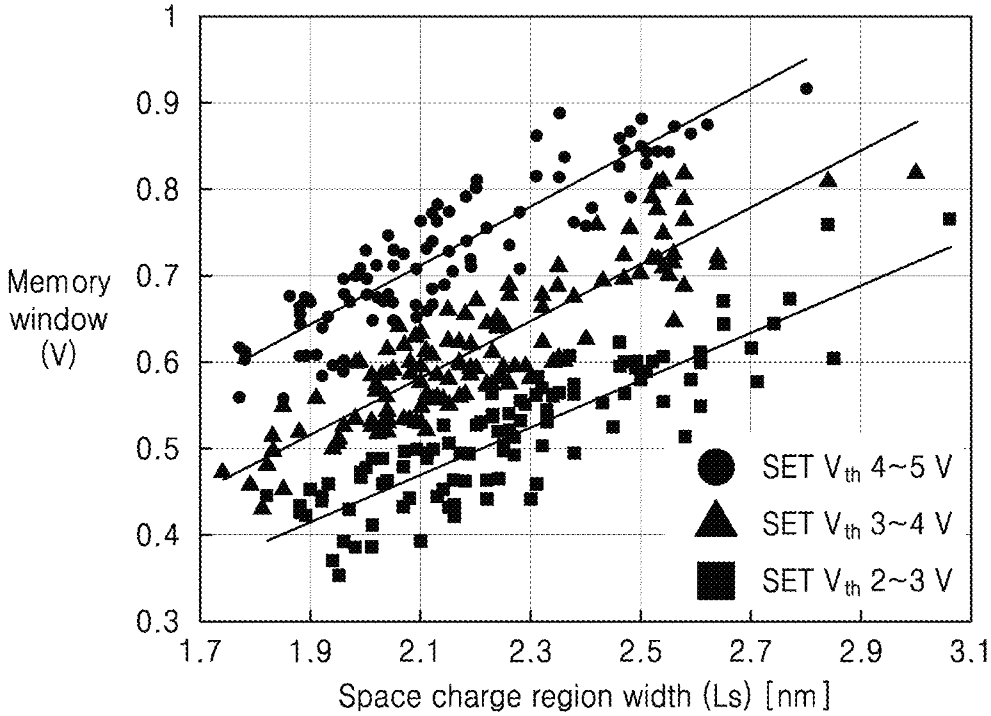
FIG. 10 is a diagram showing a result indicating a trend of a memory window according to a width of a space charge region by performing simulations on about 500 kinds of Se-based ternary semiconductor compounds.

FIG. 10 is a diagram showing a result indicating a trend of a memory window according to a width Ls of a space charge region by performing simulations on about 500 kinds of Se-based ternary semiconductor compounds. Referring to FIG. 10, as the width of the space charge region increases, the memory window tends to increase.

Table 1 below is a simulation result showing examples of materials having relatively large memory windows from among 500 kinds of Se-based ternary semiconductor compounds. In Table 1 below, Es denotes a band gap and ΔVth denotes the memory window. In addition, Ls denotes the width of the space charge region and $I_{off}$ denotes an off-current.

TABLE 1

| Compound | Dielectric Constant | Trap Density (Å$^{-3}$) | Eg (eV) | ΔVth (V) | Ls (nm) | SET Vth (V) | Ioff (nA) | RESET Vth (V) |
|---|---|---|---|---|---|---|---|---|
| $P_{0.3}Sb_{0.3}Se_{0.4}$ | 14.9 | 0.95 | 1.88 | 0.823 | 2.78 | 3.9 | 0.31 | 4.72 |
| $Sn_{0.4}Sb_{0.2}Se_{0.4}$ | 22.5 | 0.99 | 1.61 | 0.822 | 3 | 3.1 | 1.84 | 3.92 |
| $In_{0.3}Sb_{0.2}Se_{0.5}$ | 12.7 | 0.86 | 1.92 | 0.763 | 2.42 | 3.89 | 0.32 | 4.65 |
| $Sn_{0.3}Sb_{0.3}Se_{0.4}$ | 19.9 | 0.92 | 1.60 | 0.76 | 2.84 | 2.98 | 1.65 | 3.74 |
| $Ga_{0.2}Sb_{0.3}Se_{0.5}$ | 11.3 | 0.72 | 1.97 | 0.715 | 2.35 | 3.8 | 0.25 | 4.52 |
| $Ge_{0.3}Sb_{0.3}Se_{0.4}$ | 16.8 | 0.87 | 1.84 | 0.71 | 2.64 | 3.07 | 1.29 | 3.78 |
| $P_{0.2}Sb_{0.2}Se_{0.6}$ | 10.9 | 0.62 | 2.19 | 0.691 | 2.35 | 3.67 | 0.19 | 4.36 |
| $Ge_{0.2}Sn_{0.2}Se_{0.6}$ | 10.7 | 0.725 | 2.14 | 0.682 | 2.26 | 3.72 | 0.29 | 4.41 |
| $Ge_{0.2}In_{0.2}Se_{0.6}$ | 8.6 | 0.72 | 2.23 | 0.645 | 2.06 | 3.99 | 0.17 | 4.64 |
| $Si_{0.3}Sb_{0.3}Se_{0.5}$ | 8.7 | 0.58 | 2.00 | 0.611 | 2.12 | 3.62 | 0.19 | 4.23 |

Referring to Table 1 above, when, in the Se-based ternary semiconductor compound, a concentration of Se is about 40 at % or greater, a concentration of X is about 12 at % or greater, and a concentration of Y' exceeds about 18 at %, a relatively large memory window was obtained. Specifically, the concentration of Se may be greater than or equal to 40 at % and less than 75 at %, the concentration of X may be greater than or equal to 12 at % and less than or equal to 40 at %, and the concentration of Y' may be greater than 18 at % and less than or equal to 40 at %. In addition, when the width Ls of the space charge region formed by the reset operation is about 2 nm or greater, a relatively large memory window may be implemented.

Table 2 below shows an actual experimental result of comparing the memory window ΔVth measured with respect to a ternary semiconductor compound ($Ge_{0.17}As_{0.31}Se_{0.52}$, $Ge_{0.21}As_{0.25}Te_{0.54}$) including As with the memory window ΔVth measured with respect to Se-based ternary semiconductor compound ($Ge_{0.22}Sb_{0.20}Se_{0.58}$) not including As according to an embodiment.

TABLE 2

| Composition | ΔVth (V) | SET Vth (V) |
|---|---|---|
| $Ge_{0.22}Sb_{0.20}Se_{0.58}$ | 2.4 | 2.75 |
| $Ge_{0.17}As_{0.31}Se_{0.52}$ | 1.2 | 3.2 |
| $Ge_{0.21}As_{0.25}Te_{0.54}$ | 0.83 | 1.85 |

Referring to Table 2 above, the Se-based ternary semiconductor compound ($Ge_{0.22}Sb_{0.20}Se_{0.58}$) according to an embodiment has a larger memory window as compared with the ternary semiconductor compound ($Ge_{0.17}As_{0.31}Se_{0.52}$, $Ge_{0.21}As_{0.25}Te_{0.54}$) including As.

Table 3 below shows results of measuring a memory window ΔVth through actual experiments performed on an exemplary Se-based ternary semiconductor compound (Ge—Sb—Se-based compound) that does not include arsenic (As). Table 3 below indicates experimental results of the memory window measured according to a concentration of an element Sb in the Ge—Sb—Se-based compound. In Table 3 below "$V_{th}$ Drift" denotes a degree of change in a threshold voltage over time.

TABLE 3

| | | Ge (at %) | Sb (at %) | Se (at %) | SET Vth (V) | Vth Drift (mV/dec) | ΔVth (V) |
|---|---|---|---|---|---|---|---|
| Non-As based compound | Sample 1 | 13.3 | 22 | 64.7 | 2.45 | 16.1 | 1.27 |
| | Sample 2 | 19.2 | 31.2 | 49.6 | 1.7 | 34.5 | 1.93 |
| | Sample 3 | 19.1 | 23.9 | 57 | 2.4 | 52.0 | 2.46 |
| | Sample 4 | 18.6 | 18.6 | 62.8 | 2.7 | 14.2 | 1.17 |
| | Sample 5 | 24.9 | 21.6 | 53.6 | 2.5 | 61.4 | 2.3 |
| | Sample 6 | 18.5 | 12.6 | 68.8 | 2.9 | 13.4 | 0.9 |
| | Sample 7 | 24.4 | 15.1 | 60.5 | 2.9 | 42.8 | 1.2 |
| | Sample 8 | 24.3 | 11.2 | 64.5 | 3.2 | 31.2 | 1 |

Referring to Table 3 above, it may be identified that Ge—Sb—Se-based compounds in which the concentration of the element Sb is greater than about 18 at % mostly have larger memory window as compared with Ge—Sb—Se-based compounds having the element Sb at a concentration of 15.1 at % or less.

Table 4 below shows results of measuring a memory window ΔVth through actual experiments on an exemplary Se-based ternary semiconductor compound (Ge—As—Se-based compound) including As. Table 4 below indicates actual experimental result of the memory window measured according to a concentration of the element As in the Ge—As—Se-based compound.

TABLE 4

| | | Ge (at %) | As (at %) | Se (at %) | SET Vth (V) | Vth Drift (mV/dec) | ΔVth (V) |
|---|---|---|---|---|---|---|---|
| As based compound | Sample 1 | 17.5 | 29.6 | 52.8 | 3.1 | 52.2 | 1.28 |
| | Sample 2 | 18.2 | 29.1 | 52.8 | 3.2 | 49.4 | 1.23 |
| | Sample 3 | 18.3 | 31.4 | 50.4 | 3.2 | 57.5 | 1.22 |
| | Sample 4 | 13.1 | 27.5 | 59.5 | 2.65 | 30.7 | 0.92 |

Referring to Table 4 above, it may be identified that Ge—As—Se-based compound including As mostly has the window memory that is similar to that of the Ge—Sb—Se-based compound having the element Sb at the concentration of 15.1 at % or less as described above.

Figure 11:
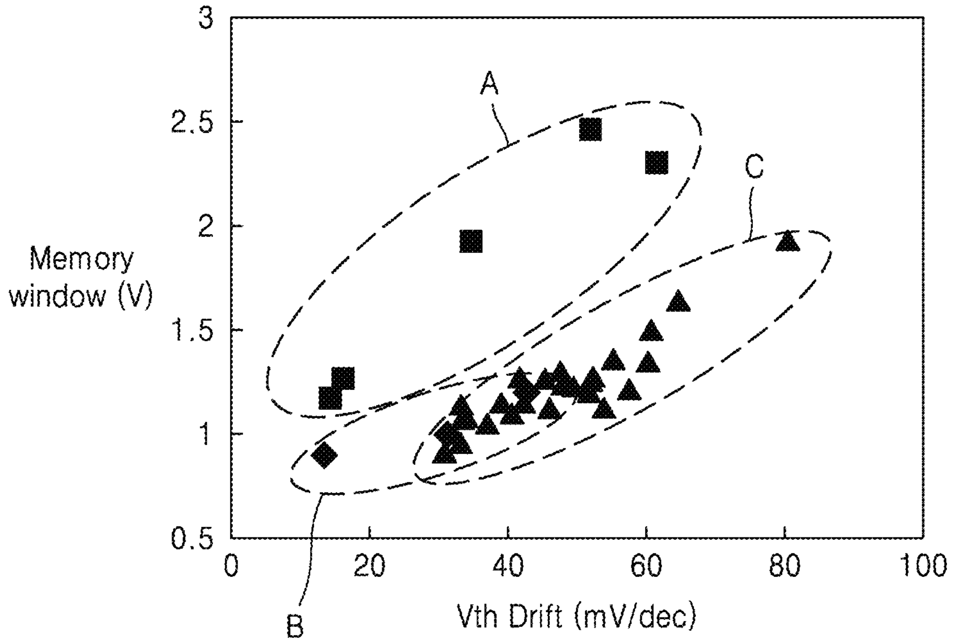
FIG. 11 is a diagram showing a result of measuring a memory window through actual experiment performed on a Se-based ternary semiconductor compound not including arsenic (As) (Ge—Sb—Se-based compound) and a ternary semiconductor compound including As (Ge—As—Se-based compound)

FIG. 11 shows a result of measuring the memory window through actual experiment performed on the Se-based ternary semiconductor compound (Ge—Sb—Se-based compound) that does not include As and the Se-based ternary semiconductor compound (Ge—As—Se-based compound) including As.

In FIG. 11, "A" indicates a window memory with respect to the Ge—Sb—Se-based compound in which the concentration of the element Sb is greater than about 18 at % shown in Table 3 above, and "B" indicates a window memory with respect to the Ge—Sb—Se-based compound in which the concentration of the element Sb is 15.1 at % or less as shown in Table 3 above. "C" indicates a window memory with respect to 28 exemplary Ge—As—Se-based compounds including As.

Referring to FIG. 11, it is identified that the Ge—Sb—Se-based compound in which the concentration of the element Sb is greater than about 18 at % generally has a larger memory window as compared with the Ge—Sb—Se-based compound in which the concentration of the element Sb is 15.1 at % or less and the Ge—As—Se-based compound.

As described above, the memory device 10 according to an embodiment may perform a memory function and a selector function with a single material by using a phenomenon in which the density of activated traps is changed according to the polarity and intensity of the bias voltage. Therefore, a unit memory cell may be implemented by using only one memory device 10 without using an additional selector. In the memory device 10 according to an embodiment, both the memory function and the selector function may be performed by one memory layer 13, and thus, an aspect ratio of the memory device 10 may be reduced, and the memory device 10 may be manufactured through relatively simple processes. Also, in the memory device 10 according to an embodiment, the memory layer 13 include the ternary semiconductor compound having a composition of $X_aY'_bSe_c$ (a+b+c=1, a>0.12, b>0.18, c≥0.4, X≠Y, X and Y are each one of In, Sb, Ga, Sn, Al, Ge, Si, and P), and thus, the memory window may be increased.

Figure 12:
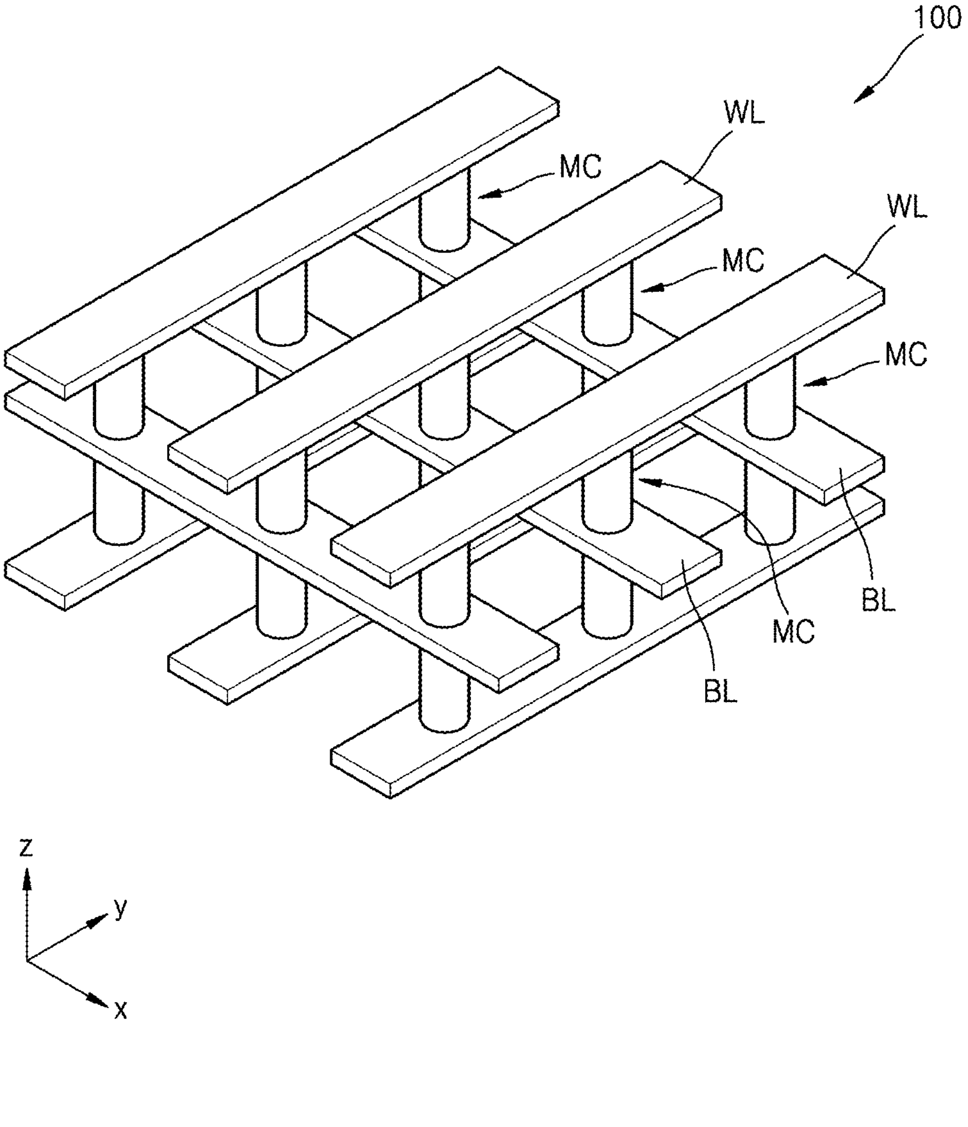
FIG. 12 is a perspective view schematically showing a memory device according to an embodiment.
Figure 13:
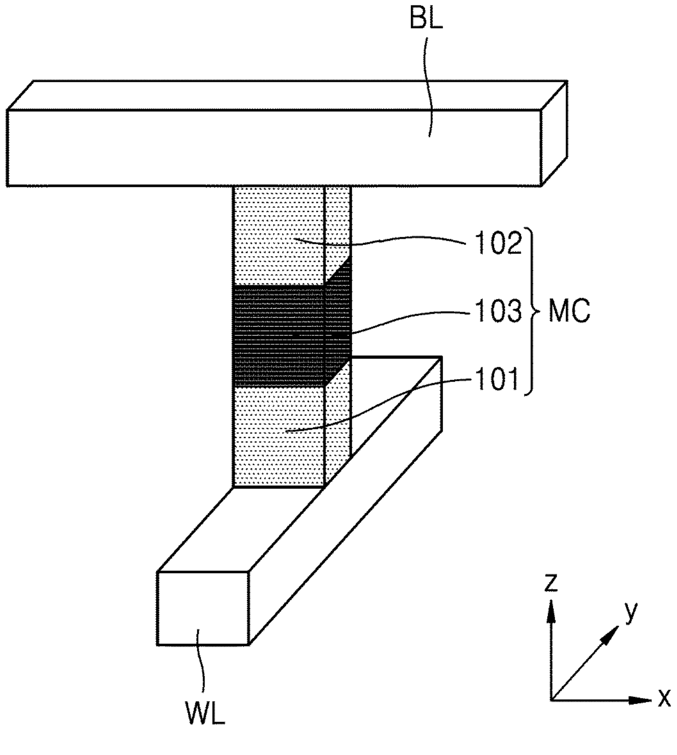
FIG. 13 is a diagram showing an enlarged view of one memory cell in a memory device of FIG. 12.

FIG. 12 is a perspective view schematically showing a memory device 100 according to some embodiments. FIG. 13 is a diagram showing an enlarged view of one memory cell MC in a memory device of FIG. 12.

Referring to FIG. 12 and FIG. 13, the memory device 100 may have three-dimensional (3D) cross-point structure. For example, the memory device 100 may include a plurality of bit lines BL extending in a first direction (that is, x-axis direction), a plurality of word lines WL extending in a second direction (that is, y-axis direction) crossing the first direction, and a plurality of memory cells MC provided on points where the plurality of bit lines BL and the plurality of word lines WL cross each other.

Each of the plurality of memory cells MC may have a bar-shape, and may correspond to the memory device 10 shown in FIG. 1. A lower electrode 101 and an upper electrode 102 may respectively correspond to the first electrode 11 and the second electrode 12 of the memory device 10 shown in FIG. 1. In addition, a memory layer 103 may correspond to the memory layer 13 of the memory device 10 shown in FIG. 1, and the memory layer 103 may have the same characteristics as those of the memory layer 13 in the memory device 10 of FIG. 1.

In this structure, the memory cell MC may be driven by a potential difference between the word line WL and the bit line BL connected to both ends of each memory cell MC. For example, when the memory layer 103 is in the first state having a first threshold voltage that is relatively low and a potential difference between the word line WL and the bit line BL is less than or equal to, for example, −4 V, the memory layer 103 may be switched to the second state having a second threshold voltage that is relatively high. Also, when the memory layer 103 is in the second state having the second threshold voltage that is relatively high and the potential difference between the word line WL and the bit line BL is greater than or equal to the second threshold voltage, e.g., +4 V, the memory layer 103 may be switched to the first state having the first threshold voltage that is relatively low. When the data recorded on the memory layer 103 is read, the potential difference between the word line WL and the bit line BL may be between the first threshold voltage and the second threshold voltage, e.g., about +3 V to about +3.5 V.

Figure 14:
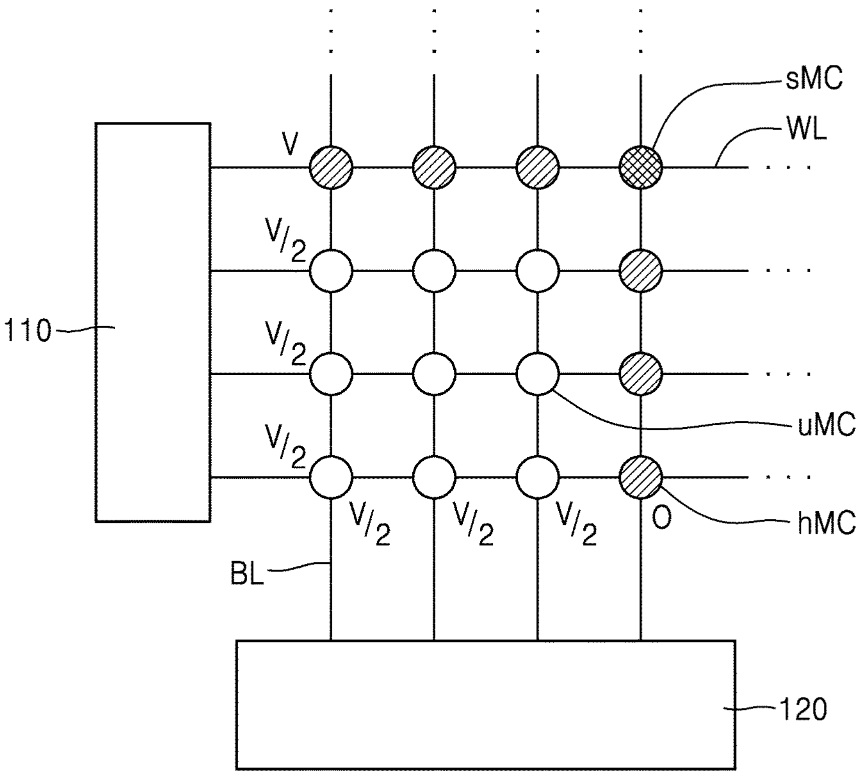
FIG. 14 is a plan view showing an example of an operation for selecting a certain memory cell in a memory device of FIG. 12.

FIG. 14 is a plan view showing an example of an operation for selecting a certain memory cell in the memory device 100 of FIG. 12. Referring to FIG. 14, the memory device 100 may further include a row decoder 110 selectively supplying a voltage to the plurality of word lines WL, and a column decoder 120 selectively supplying a voltage to the plurality of bit lines BL. When a voltage V is to be applied to one selected memory cell sMC from among the plurality of memory cells MC, the row decoder 110 may provide the voltage V to the word line WL connected to the selected memory sMC and a voltage V/2 to the other word lines WL. Here, the column decoder 120 may provide a voltage of 0 V to the bit line BL connected to the selected memory sMC and provide a voltage V/2 to the other bit lines BL.

Then, the potential difference between the word line WL and the bit line BL of the selected memory cell sMC is V. On the other hand, the potential difference between the word line WL to which the voltage V/2 is supplied and the bit line BL to which the voltage V/2 is supplied is 0 V. Therefore, the voltage is not applied to a non-selected memory cell uMC arranged between the word line WL and the bit line BL that are not connected to the selected memory cell sMC. In addition, a voltage V/2 may be applied to both ends of a half-selected memory cell hMC that is connected to the word line WL same as that of the selected memory cell sMC or the bit line BL same as that of the selected memory cell sMC. Each of the plurality of memory cells MC is a self-selecting memory device having the threshold voltage as described above, and thus, the half-selected memory cell hMC adjacent to the selected memory cell sMC is not turned on even when being applied with the voltage V/2, and accordingly, a sneak current rarely occurs.

Figure 15:
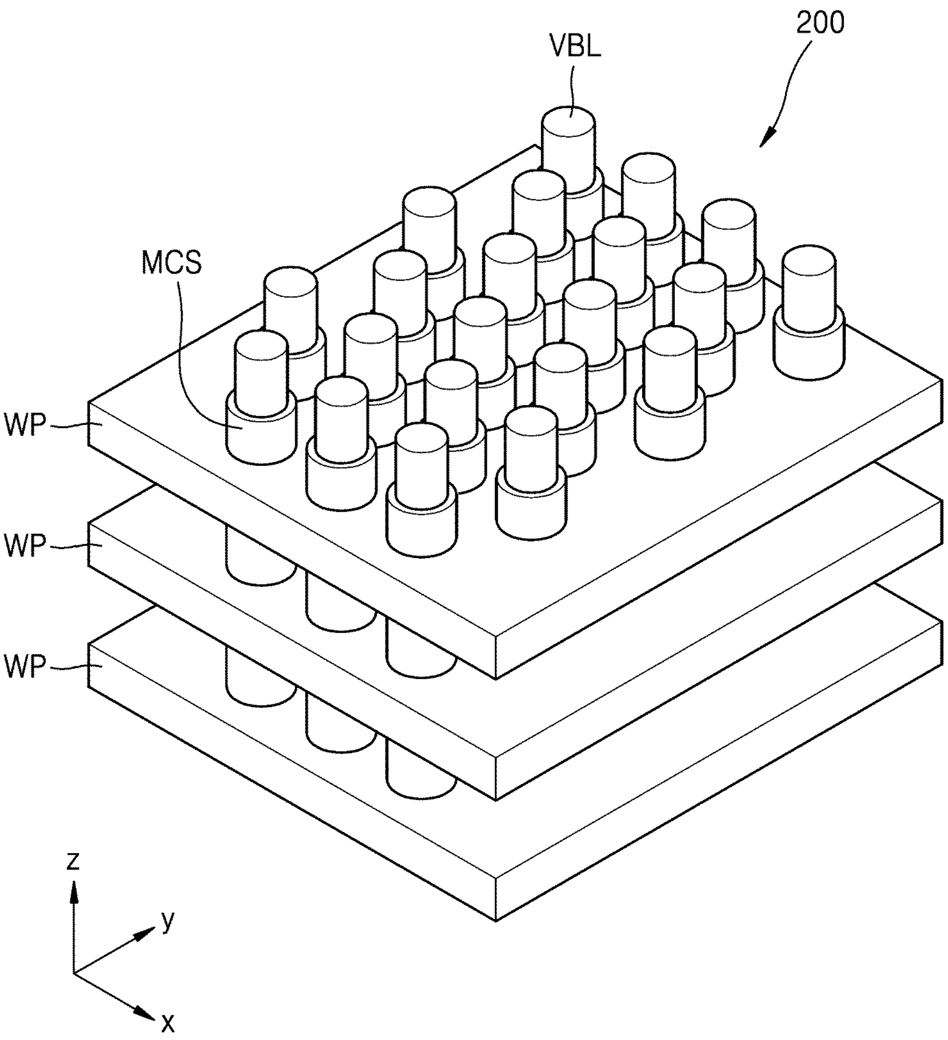
FIG. 15 is a perspective view schematically showing a memory device according to an embodiment.

FIG. 15 is a perspective view schematically showing a memory device 200 according to another embodiment.

Referring to FIG. 15, the memory device 200 may include a plurality of word planes WP that extend along a plane including the first direction and the second direction and are spaced apart from one another along a third direction (that is, z-axis direction) crossing the first and second directions, a plurality of vertical bit lines VBL that extend in the third direction and are two-dimensionally arranged along the first direction and the second direction, and a plurality of memory cell strings MCS that extend in the third direction while surrounding surfaces of the plurality of vertical bit lines VBL. The plurality of memory cell strings MCS may be also two-dimensionally arranged in the first and second directions, like the plurality of vertical bit lines VBL. Each of the plurality of memory cell strings MCS and each of the plurality of vertical bit lines VBL may be arranged to pass through the plurality of word planes WP in the third direction. Because each of the plurality of memory cell strings MCS extends in the vertical direction, the memory device 200 shown in FIG. 14 may be referred to as a vertical-type memory device (that is, VNAND memory device) and may have an improved memory capacity. Each of the plurality of memory cell strings MCS may include the same material as that of the memory layer 13 in the memory device 10 of FIG. 1.

Figure 16:
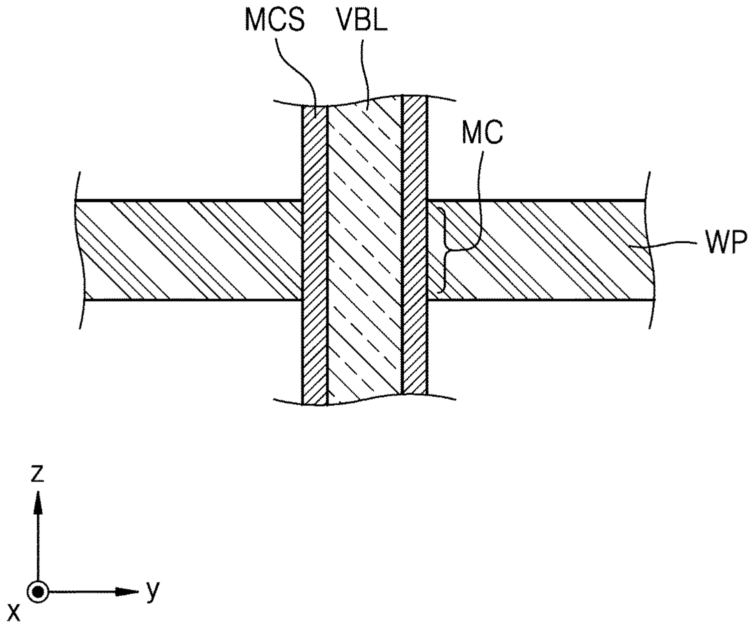
FIG. 16 is a vertical section schematically showing a structure of one memory cell in a memory device of FIG. 15.
Figure 17:
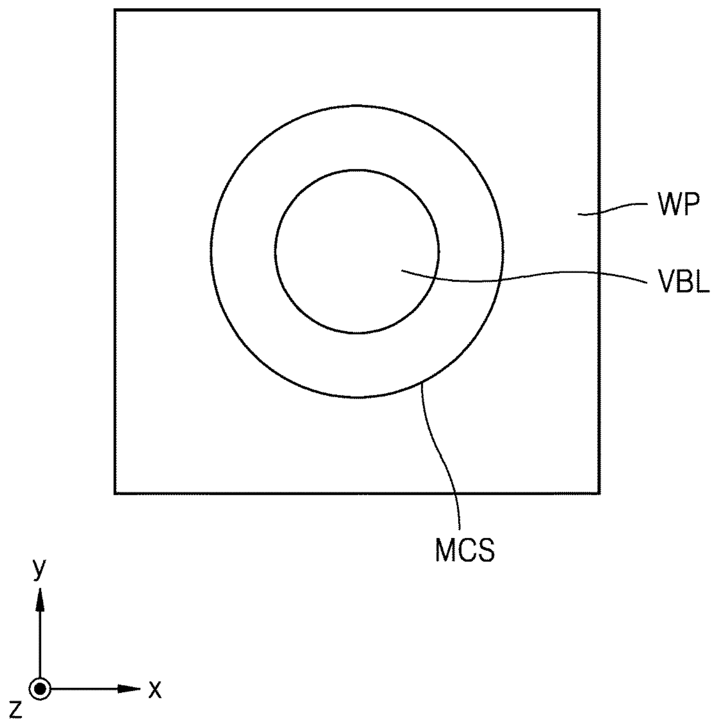
FIG. 17 is a horizontal section schematically showing a structure of one memory cell in a memory device of FIG. 15.

FIG. 16 is a vertical section schematically showing a structure of one memory cell in the memory device 200 shown in FIG. 15. FIG. 17 is a horizontal section schematically showing a structure of one memory cell in the memory device 200 shown in FIG. 15.

Referring to FIG. 16 and FIG. 17, each word plane WP and the memory cell string MCS and the vertical bit line VBL surrounded by the word plane WP may form one memory cell. Here, the memory cell may correspond to the memory device 10 shown in FIG. 1. The word plane WP and the vertical bit line VBL may respectively correspond to the first electrode 11 and the second electrode 12 of the memory device 10 shown in FIG. 1. In addition, the memory cell string MCS may correspond to the memory layer 13 of the memory device 10 shown in FIG. 1, and the memory cell string MCS may have the same characteristics as those of the memory layer 13 in the memory device 10 of FIG. 1.

Figure 18:
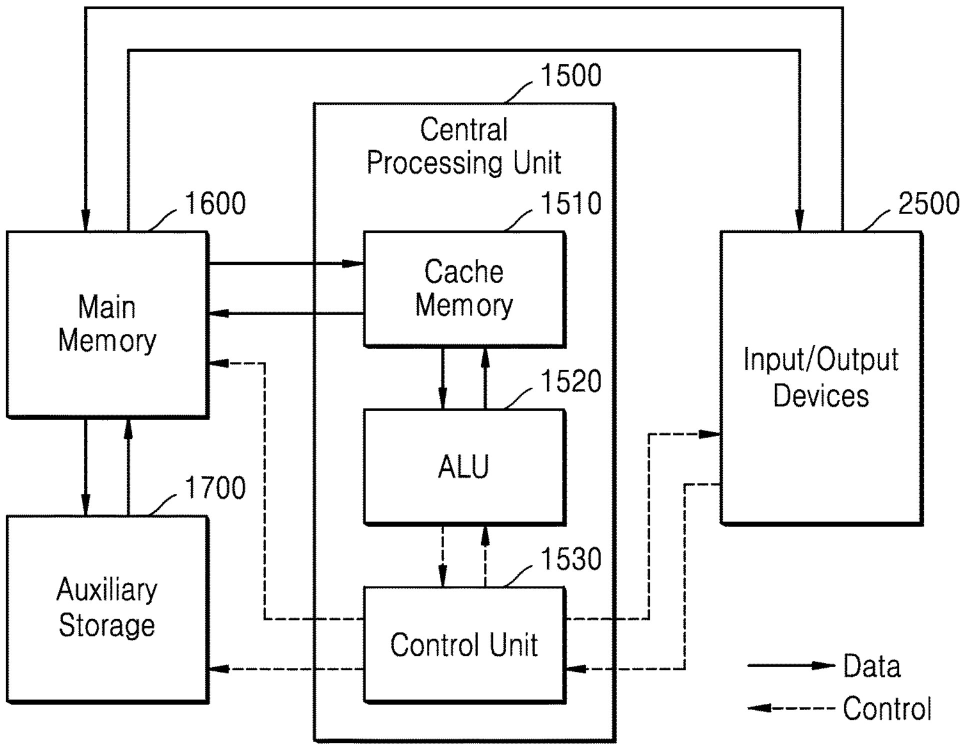
FIG. 18 is a conceptual diagram schematically showing a device architecture that may be applied to an example of an electronic apparatus.

The memory device 100 or 200 according to the embodiment as described above may be used to store data in various electronic apparatuses, such as to store data in a mobile phone, a tablet computer, a electronic watch, a laptop computer, a desktop computer, a notebook computer, or a television, but example embodiments are not limited thereto. FIG. 18 is a conceptual diagram schematically showing device architectures applied to an electronic apparatus, according to an embodiment.

Referring to FIG. 18, a cache memory 1510, an ALU 1520, and a control unit 1530 may configure a central processing unit 1500, and the cache memory 1510 may include a static random access memory (SRAM). Separate from the CPU 1500, a main memory 1600 and an auxiliary storage 1700 may be provided. The main memory 1600 may include a DRAM device, and the auxiliary storage 1700 may include the memory device 100 or 200 described above.

In some embodiments, input/output devices 2500 (e.g., keyboard, touchscreen display) may also be provided. In some cases, a device architecture may be implemented in a form in which computing unit devices and memory unit devices are adjacent to each other in one chip, without distinction of sub-units.

The memory device 100 and 200 according to the embodiments may be implemented as a chip-type memory block to be used as a neuromorphic computing platform or used to construct a neural network.

Figure 19:
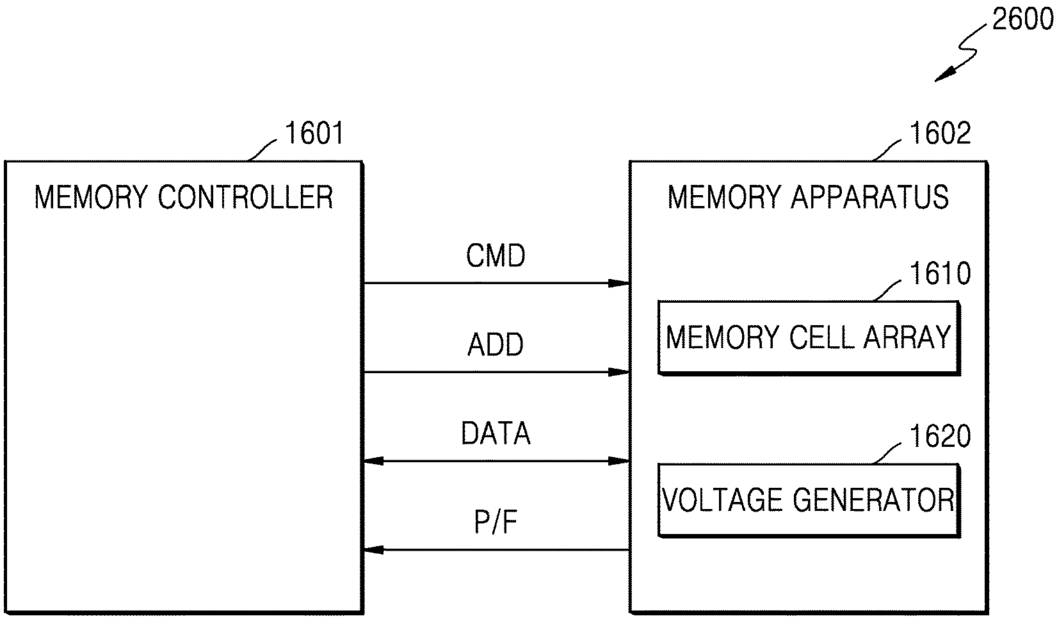
FIG. 19 is a block diagram of a memory system according to an embodiment.

FIG. 19 is a block diagram of a memory system 2600 according to an embodiment.

Referring to FIG. 19, the memory system 2600 may include a memory controller 1601 and a memory device 1602. The memory controller 1601 performs a control operation on the memory device 1602, for example, the memory controller 1601 may provide the memory device 1602 with a command CMD for performing a programming (or recording), reading, and/or erasing operation on an address ADD and the memory device 1602. Also, data for the programming operation and read data may be transferred between the memory controller 1601 and the memory device 1602.

The memory device 1602 may include a memory cell array 1610 and a voltage generator 1620. The memory cell array 1610 may include a plurality of memory cells and may include the memory device 100 or 200 according to an embodiment.

The memory controller 1601 may include processing circuitry such as hardware including a logic circuit, a combination of hardware/software such as processor executed software, or a combination thereof. For example, the processing circuit may include, in particular, a central processing unit (CPU), an arithmetic logic unit (ALU), a digital signal processor, a micro-computer, a field programmable gate array (FPGA), a system-on-chip (SoC), a programmable logic unit, a micro-processor, an application-specific integrated circuit (ASIC), etc., but is not limited thereto. The memory controller 1601 may operate in response to a request from a host (not shown) and may access the memory device 1602 to control the control operation (e.g., recording/reading operation) discussed as above, and thus, the memory controller 1601 may be converted into a special purpose controller. The memory controller 1601 may generate an address ADD and a command CMD for performing programming/reading/erasing operations on the memory cell array 1610. Also, in response to the command from the memory controller 1601, the voltage generator 1620 (e.g., power circuit) may generate a voltage control signal for controlling a voltage level of a word line in order to perform data programming or data reading on the memory cell array 1610.

Also, the memory controller 1601 may perform a determination operation with respect to the data read from the memory device 1602. For example, from the data read from the memory cell, the number of on-cells and/or the number of off-cells may be determined. The memory device 1602 may provide the memory controller 1601 with a pass/fail signal (P/F) according to the determination result with respect to the read data. The memory controller 1601 may control the writing/reading operation of the memory cell array 1610 with reference to the pass/fail signal (P/F).

Figure 20:
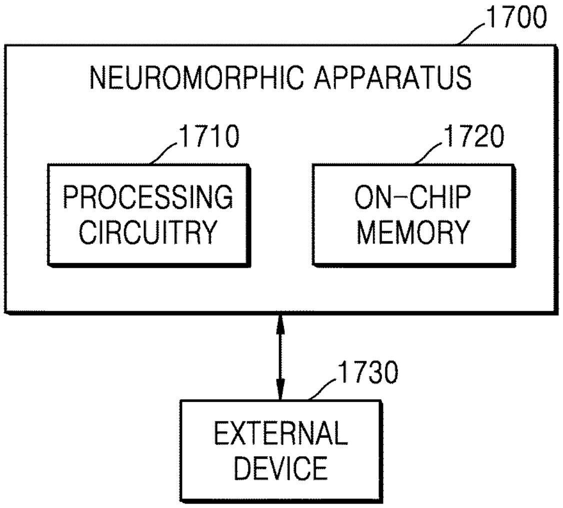
FIG. 20 is a block diagram showing a neuromorphic device and an external device connected to the neuromorphic device according to an embodiment.

FIG. 20 is a block diagram showing a neuromorphic device 1700 and an external device connected to the neuromorphic device according to an embodiment.

Referring to FIG. 20, the neuromorphic device 1700 may include a processing circuit 1710 and/or an on-chip memory 1720. The neuromorphic device 1700 may include the memory device 100 or 200 according to the embodiment.

In some embodiments, the processing circuit 1710 may be configured to control functions for driving the neuromorphic device 1700. For example, the processing circuit 1710 may be configured to control the neuromorphic device 1700 by executing a program stored in the on-chip memory 1720. In some embodiments, the processing circuit 1710 may include hardware such as a logic circuit, hardware/software combination such as a processor executing software, or a combination thereof. For example, the processor may include, but is not limited to, a CPU, a graphic processing unit (GPU), an application processor (AP) included in the neuromorphic device 1700, an ALU, a digital signal processor, a microcomputer, a FPGA, an SoC, a programmable logic unit, a micro-processor, an ASIC, etc. In some embodiments, the processing circuit 1710 may be configured to read/record various data with respect to an external device 1730 and/or to execute the neuromorphic device 1700 by using the read/recorded data. In some embodiments, the external device 1730 may include an external memory and/or sensor array having an image sensor (e.g., CMOS image sensor circuit).

In some embodiments, the neuromorphic device 1700 of FIG. 20 may be applied to a machine learning system. The machine learning system may use various artificial neural network organization and processing models, such as a convolution neural network (CNN), a de-convolution neural network, a repeated neural network (RNN) selectively including a long short-term memory (LSTM) unit and/or gated recurrent unit (GRU), a stacked neural network (SNN), a state-space dynamic neural network (SSDNN), deep belief network (DBN), a generative adversarial network (GAN) and/or restricted Boltzmann machine (RBM).

Alternatively or additionally, such machine learning systems may include other types of machine learning models, for example, linear and/or logistic regression, statistics clustering, Bayesian classification, determination trees, dimensional reduction such as main component analyses, expert systems, and/or random forests; or a combination thereof. The machine learning models may be used to provide various services and/or applications. For example, an image classification service, a user authentication service based on biometric information or biometric data, an advanced driver assistance system (ADAS) service, a voice assistance service, an automatic speech recognition (ASR) service, etc. may be executed by an electronic device.

The memory device 10, 100, or 200 according to an embodiment may perform a memory function and a selector function with a single material by using a phenomenon in which the density of activated traps is changed according to the polarity and intensity of the bias voltage. Therefore, a unit memory cell may be implemented by using only one memory device without using an additional selector. In the memory device 10, 100 or 200 according to an embodiment, both the memory function and the selector function may be performed by one memory layer, and thus, an aspect ratio of the memory device may be reduced, and the memory device may be manufactured through relatively simple processes. Also, in the memory device 10, 100, or 200 according to an embodiment, the memory layer includes the ternary semiconductor compound having a composition of $X_aY'_bSe_c$ ($a+b+c=1$, $a>0.12$, $b>0.18$, $c\geq0.4$, $X\neq Y$, X and Y' are each one of In, Sb, Ga, Sn, Al, Ge, Si, and P), and thus, the memory window may be increased.

While the memory device 10, 100, or 200 has been particularly shown and described with reference to example embodiments thereof, it will be understood by those of ordinary skill in the art that various changes in form and details may be made therein without departing from the spirit and scope as defined by the following claims.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A chalcogenide-based memory material comprising:

a ternary semiconductor compound having a composition represented by $X_aY'_bSe_c$, wherein the chalcogenide-based memory material has an ovonic threshold-switching (OTS) characteristic, a threshold voltage of the chalcogenide-based memory material changes according to a polarity and an intensity of an applied voltage, in $X_aY'_bSe_c$, X≠Y', a+b+c=1, a>0.12, b>0.18, c≥0.4, and X and Y' are independently different ones of In, Sb, Ga, Sn, Al, Ge, Si, and P, wherein the chalcogenide-based memory material is configured to form a space charge region having a width of at least 2 nm during a reset operation of a memory cell.

2. The chalcogenide-based memory material of claim 1, wherein a concentration of X is greater than 12 at % and less than or equal to 40 at % in the ternary semiconductor compound.

3. The chalcogenide-based memory material of claim 1, wherein a concentration of Y' is greater than 18 at % and less than or equal to 40 at % in the ternary semiconductor compound.

4. The chalcogenide-based memory material of claim 1, wherein a concentration of Se is greater than or equal to 40 at % and less than 75 at % in the ternary semiconductor compound.

5. A memory device comprising:

a plurality of memory cells, wherein each of the plurality of memory cells includes a first electrode and a second electrode spaced apart from each other and facing each other, and a memory layer between the first electrode and the second electrode, the memory layer has an OTS characteristic, a threshold voltage of the memory layer changes according to a polarity and an intensity of an applied voltage, the memory layer includes a ternary semiconductor compound having a composition of $X_aY'_bSe_c$, where in $X_aY'_bSe_c$, X≠Y', a+b+c=1, a>0.12, b>0.18, c≥0.4, and X and Y' are independently different ones of In, Sb, Ga, Sn, Al, Ge, Si, and P, wherein a width of a space charge region in the memory layer due to a reset operation of a memory cell is greater than or equal to 2 nm.

6. The memory device of claim 5, wherein a concentration of the X is greater than 12 at % and less than or equal to 40 at % in the ternary semiconductor compound.

7. The memory device of claim 5, wherein a concentration of the Y' is greater than 18 at % and less than or equal to 40 at % in the ternary semiconductor compound.

8. The memory device of claim 5, wherein a concentration of Se is greater than or equal to 40 at % and less than 75 at % in the ternary semiconductor compound.

9. The memory device of claim 5, wherein a first state of the memory layer has a first threshold voltage, a second state of the memory layer has a second threshold voltage, and the second threshold voltage is greater than the first threshold voltage.

10. The memory device of claim 9, wherein when the memory layer is in the first state, the memory layer converts from the first state to the second state in response to applying a negative bias voltage to the memory layer so that a current flows from the first electrode to the second electrode.

11. The memory device of claim 9, wherein when the memory layer is in the second state, the memory layer converts from the second state into the first state in response to applying a positive bias voltage that is greater than or equal to the second threshold voltage to the memory layer so that a current flows from the second electrode to the first electrode.

12. The memory device of claim 9, wherein a read voltage between the first threshold voltage and the second threshold voltage is applied to the memory layer in a read operation.

13. The memory device of claim 5, wherein the memory device has a three-dimensional cross point structure.

14. The memory device of claim 13, further comprising:

a plurality of bit lines extending in a first direction; and a plurality of word lines extending in a second direction, the second direction crossing the first direction, wherein the plurality of memory cells are respectively provided at points where the plurality of bit lines and the plurality of word lines cross each other.

15. The memory device of claim 5, wherein the memory device has a VNAND structure.

16. The memory device of claim 14, wherein the plurality of memory cells are arranged in a third direction, and the third direction is perpendicular to a plane including the first direction and the second direction.

17. The memory device of claim 16, further comprising:

a plurality of word planes that extend along a plane including the first direction and the second direction, the plurality of word planes being spaced apart from each other in the third direction;

a vertical bit line passing through the plurality of word planes and extending in the third direction; and a memory cell string extending in the third direction while surrounding the vertical bit line, wherein one memory cell is defined by a corresponding one of the plurality of word planes surrounding a portion of the memory cell string surrounding a portion of the vertical bit line.

18. An electronic apparatus comprising:

the memory device of claim 5.

* * * * *